(12) United States Patent
Tanaka

(10) Patent No.: US 7,138,833 B2
(45) Date of Patent: Nov. 21, 2006

(54) SELECTOR CIRCUIT

(75) Inventor: Tomohiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 137 days.

(21) Appl. No.: 11/061,474

(22) Filed: Feb. 22, 2005

(65) Prior Publication Data

US 2006/0114021 A1 Jun. 1, 2006

(30) Foreign Application Priority Data

Nov. 26, 2004 (JP) .............................. 2004-342804

(51) Int. Cl.
*H03K 19/20* (2006.01)
(52) U.S. Cl. ...................................... 326/113; 326/121
(58) Field of Classification Search ................. 326/112, 326/113, 119, 121
See application file for complete search history.

(56) References Cited

U.S. PATENT DOCUMENTS

| | | | |
|---|---|---|---|
| 4,916,336 A * | 4/1990 | Houston | 326/108 |
| 5,808,483 A | 9/1998 | Sako | |
| 6,084,437 A | 7/2000 | Sako | |
| 6,097,221 A | 8/2000 | Sako | |
| 6,194,914 B1 | 2/2001 | Sako | |
| 6,525,575 B1 * | 2/2003 | Hirobe | 327/108 |
| 2003/0198094 A1 * | 10/2003 | Walker | 365/200 |

FOREIGN PATENT DOCUMENTS

| | | |
|---|---|---|
| JP | 9-93118 | 4/1997 |
| JP | 9-162723 | 6/1997 |

* cited by examiner

*Primary Examiner*—Don Le
(74) *Attorney, Agent, or Firm*—Westerman, Hattori, Daniels & Adrian, LLP.

(57) ABSTRACT

A plurality of conduction control circuits controls conduction of input signals. A logical operation circuit receives output signals from each of the conduction control circuits via a plurality of signal paths, and performs a logical operation on each of the output signals to output a single signal. A signal-level setting circuit sets, when the conduction of the input signals in the conduction control circuits connected to a same signal path is blocked, a signal level of the signal path. A control-signal generating circuit generates a first control signal that controls the conduction control circuits to select only one input signal for conduction, and a second control signal that controls the signal-level setting circuit to set the signal level of the signal path, by performing a logical operation on a same input signal.

5 Claims, 8 Drawing Sheets

| I | J | XSELA | SELA | XSELB | SELB | XSELC | SELC | XSELD | SELD | NSL1 | NSL2 |
|---|---|-------|------|-------|------|-------|------|-------|------|------|------|
| L | L | L | H | H | L | H | L | H | L | H | L |
| H | L | H | L | L | H | H | L | H | L | H | L |
| L | H | H | L | H | L | L | H | H | L | L | H |
| H | H | H | L | H | L | H | L | L | H | L | H |

| | 1 | 2 | 3 | 4 | 5 | 6 | 7 | 8 |
|---|---|---|---|---|---|---|---|---|
| I | L | H | L | L | H | H | L | H |
| J | L | L | H | L | H | L | H | H |
| K | L | L | L | H | L | H | H | H |
| XSELA | L | H | H | H | H | H | H | H |
| SELA | H | L | L | L | L | L | L | L |
| XSELB | H | L | H | H | H | H | H | H |
| SELB | L | H | L | L | L | L | L | L |
| XSELC | H | H | L | H | H | H | H | H |
| SELC | L | L | H | L | L | L | L | L |
| XSELD | H | H | H | H | L | H | H | H |
| SELD | L | L | L | L | H | L | L | L |
| XSELE | H | H | H | L | H | H | H | H |
| SELE | L | L | L | H | L | L | L | L |
| XSELF | H | H | H | H | H | L | H | H |
| SELF | L | L | L | L | L | H | L | L |
| XSELG | H | H | H | H | H | H | L | H |
| SELG | L | L | L | L | L | L | H | L |
| XSELH | H | H | H | H | H | H | H | L |
| SELH | L | L | L | L | L | L | L | H |
| NSL1 | H | H | L | L | L | L | L | L |
| NSL2 | L | L | H | L | H | L | L | L |
| NSL3 | L | L | L | H | L | H | L | L |
| NSL4 | L | L | L | L | L | L | H | H |

SELECTOR CIRCUIT

BACKGROUND OF THE INVENTION

1) Field of the Invention

The present invention relates to a selector circuit that receives a plurality of input signals and outputs a single output signal, and more particularly, to a selector circuit that can suppress increase in a wiring area, slowing off of a signal waveform, and a delay of signal transfer.

2) Description of the Related Art

Conventionally, selector circuits are widely used in various information processing devices. A selector circuit is a circuit that selects and outputs only one input signal from among a plurality of input signals.

Figure 7:
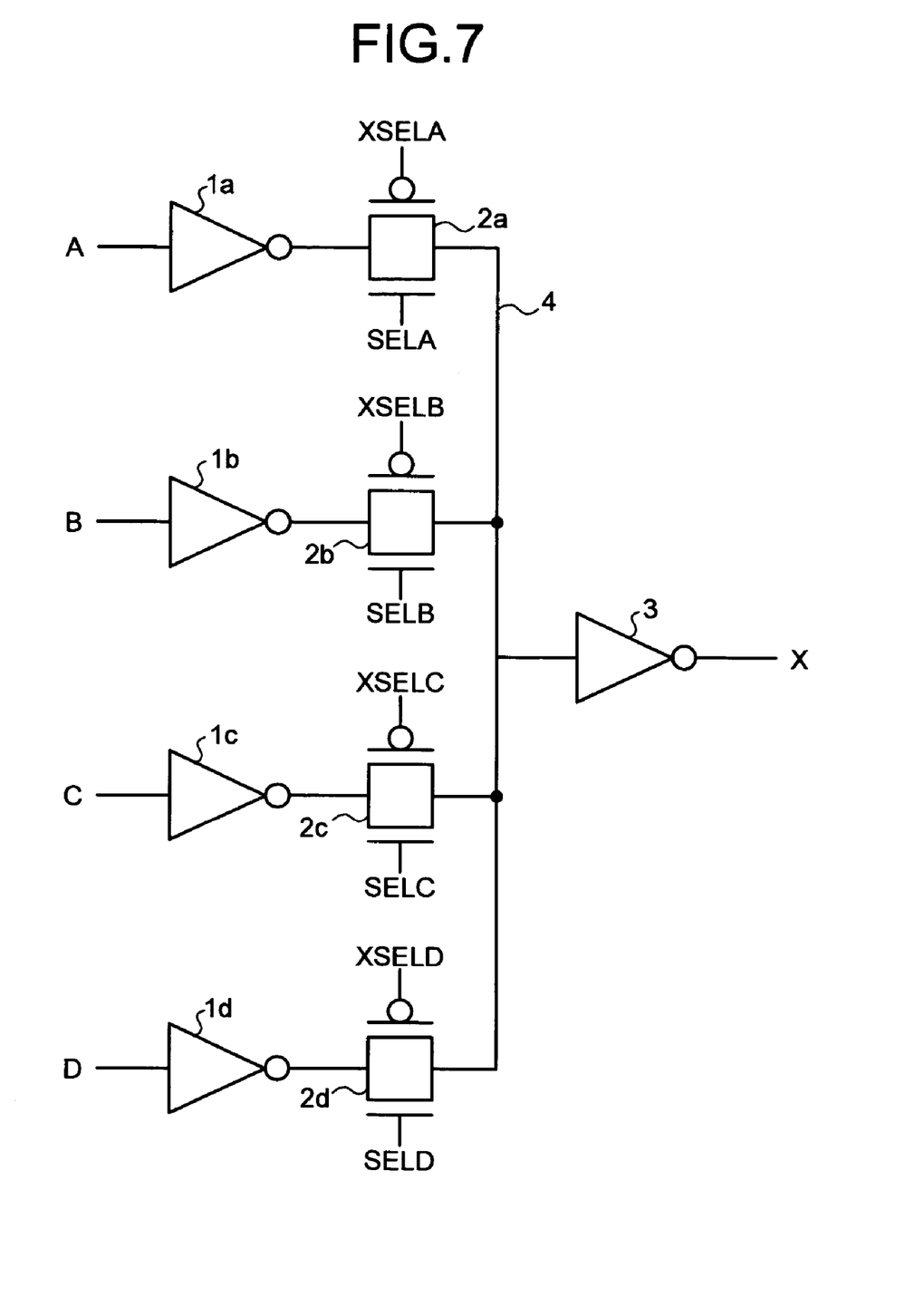
FIG. 7 is a circuit diagram of an example of a conventional selector circuit.

FIG. 7 is a circuit diagram of an example of a conventional selector circuit. FIG. 7 is an example of the selector circuit that selects and outputs one input signal from among four input signals A to D. In the selector circuit, inverter circuits 1a to 1d invert the signal levels of the input signals A to D, and the input signals with the inverted signal levels become the input signals of pass transistor circuits 2a to 2d.

Further, the pass transistor circuits 2a to 2d control conduction of the input signals received from the inverter circuits 1a to 1d according to control signals SELA to SELD and XSELA to XSELD.

The signal levels of the control signal SELA and the control signal XSELA are mutually inverted. To be specific, when the signal level of the control signal SELA is "H" (High), the signal level of the control signal XSELA becomes "L" (Low). Conversely, when the signal level of the control signal SELA is "L", the signal level of the control signal XSELA becomes "H".

Similarly, the signal levels of the control signal SELB and the control signal XSELB, the signal levels of the control signal SELC and the control signal XSELC, and the signal levels of the control signal SELD and the control signal XSELD are also mutually inverted.

Further, among the control signals XSELA to XSELD, only one signal is set to a different signal level than the rest of the control signals XSELA to XSELD. For example, when the signal level of the control signal XSELA is "L", the signal level of the control signals XSELB to XSELD becomes "H".

The pass transistor circuits 2a to 2d conduct the signals when the signal level of the control signals XSELA to XSELD is "L", and block the signals when the signal level of the control signals XSELA to XSELD is "H".

As a result, among the signals that are output from the inverter circuits 1a to 1d, only one signal is input into an inverter circuit 3 via a wire 4, and an output signal X with an inverted signal level is output.

Figure 8:
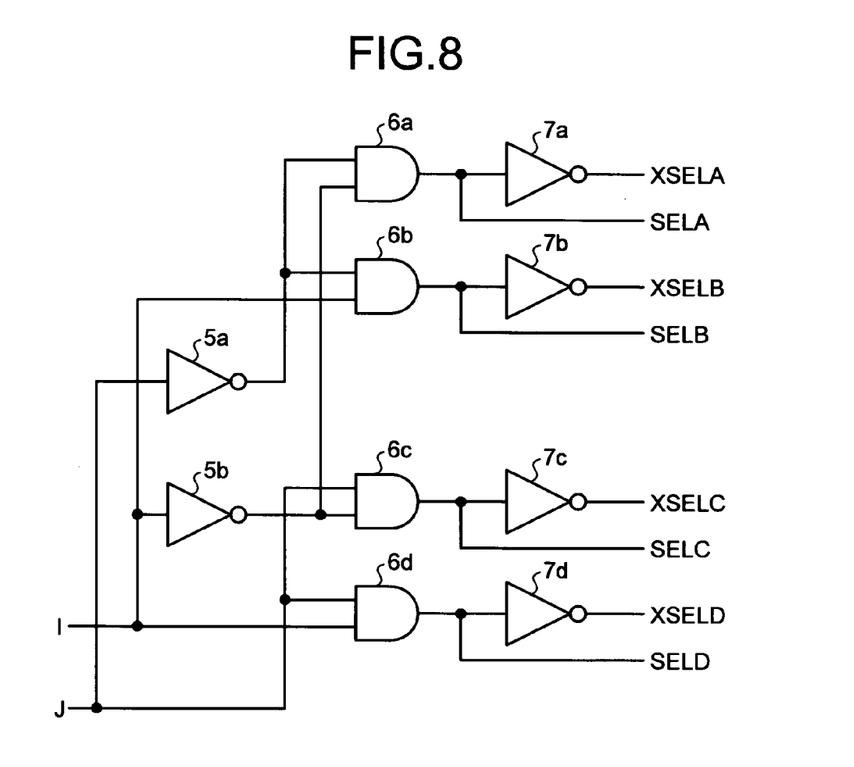
FIG. 8 is a circuit diagram of a control-signal generating circuit that generates control signals SELA to SELD and XSELA to XSELD input into pass transistor circuits 2a to 2d shown in FIG. 7.

The inverter circuits 1a to 1d and the inverter circuit 3 are provided in a selector circuit shown in FIG. 8 in order to stabilize the signal potential of the input signals A to D and the output signal X.

FIG. 8 is a circuit diagram of a control-signal generating circuit that generates control signals SELA to SELD and XSELA to XSELD input into pass transistor circuits 2a to 2d shown in FIG. 7.

Figure 9:
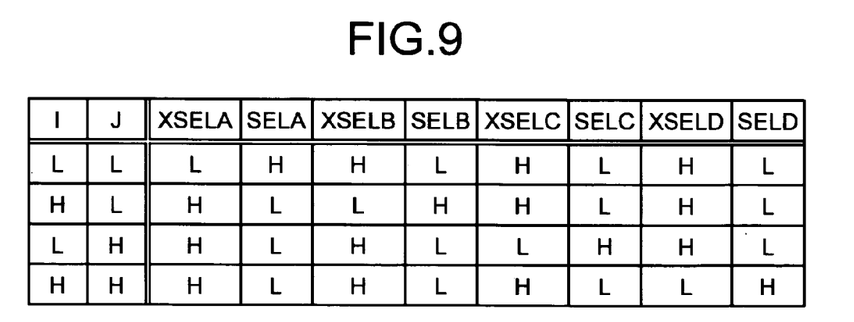
FIG. 9 is a table of signal levels of the signals that are generated by the control-signal generating circuit shown in FIG. 8.

In the control-signal generating circuit shown in FIG. 8, pairs of control signals with mutually inverted signal levels can be generated according to the combination of the input signals I and J. In other words, pairs of the control signals SELA and XSELA, the control signals SELB and XSELB, the control signals SELC and XSELC, and the control signals SELD and XSELD can be generated. Moreover, from among the control signals XSELA to XSELD, only one signal can be set to a different signal level than the rest of the control signals XSELA to XSELD. FIG. 9 is a table of signal levels of the signals that are generated by the control-signal generating circuit shown in FIG. 8.

In the selector circuit in FIG. 7, when the distance between the pass transistor circuits 2a to 2d and the inverter circuit 3 is large, the wiring area can be reduced by integrating four wires into a single one and extending the integrated wire. However, this increases the load capacitance of the wire 4, thus causing slowing of the waveforms of the input signals that are input in the inverter circuit 3, resulting in signaling delay.

Forming a plurality of signal input systems and designing circuits in a way so that a plurality of output signals from these signal input systems are received in a multi-input CMOS logic circuit can overcome this drawback, as disclosed in Japanese Patent Laid-Open Publication No. H9-93118.

Figure 10:
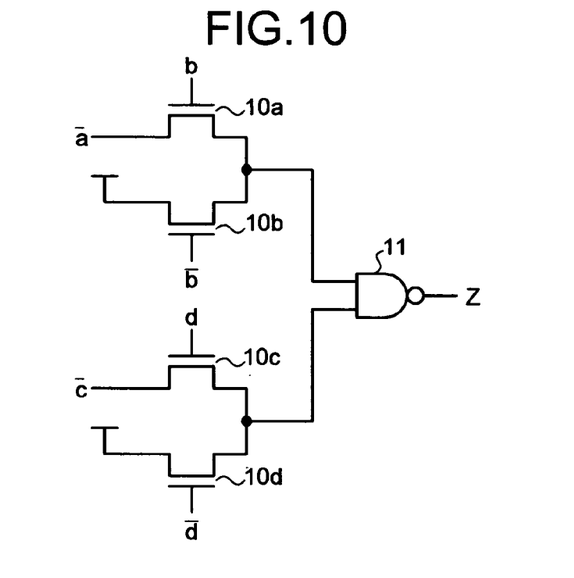
FIG. 10 is a circuit diagram of a conventional pass transistor logic circuit.

FIG. 10 is a circuit diagram of a conventional pass transistor logic circuit disclosed in Japanese Patent Laid-Open Publication No. H9-93118. In the pass transistor logic circuit, a pass transistor circuit 10a and a pass transistor circuit 10b form a first signal input system. A pass transistor circuit 10c and a pass transistor circuit 10d form a second signal input system.

Output signals from the first and the second signal input systems, are input into a NAND circuit 11 via two wires. Thus, by inputting the output signals from the first and the second signal input system into the NAND circuit 11 to separate wires, the load capacitance of the wires can be reduced, thereby remedying slowing of signal waveforms and signaling delay.

Moreover, in the circuit in FIG. 10, since even extending the wire can reduce the load capacitance of the wire, the pass transistor circuits 10a to 10d can be provided at a distance from the NAND circuit 11 when it is not possible to secure a wiring area around the NAND circuit 11.

In this case, the wiring area of the NAND circuit 11 with the pass transistor circuits 10a to 10d is substantially similar to that the wiring area shown in FIG. 7. Thus, the increase in the wiring area can be prevented.

Figure 11:
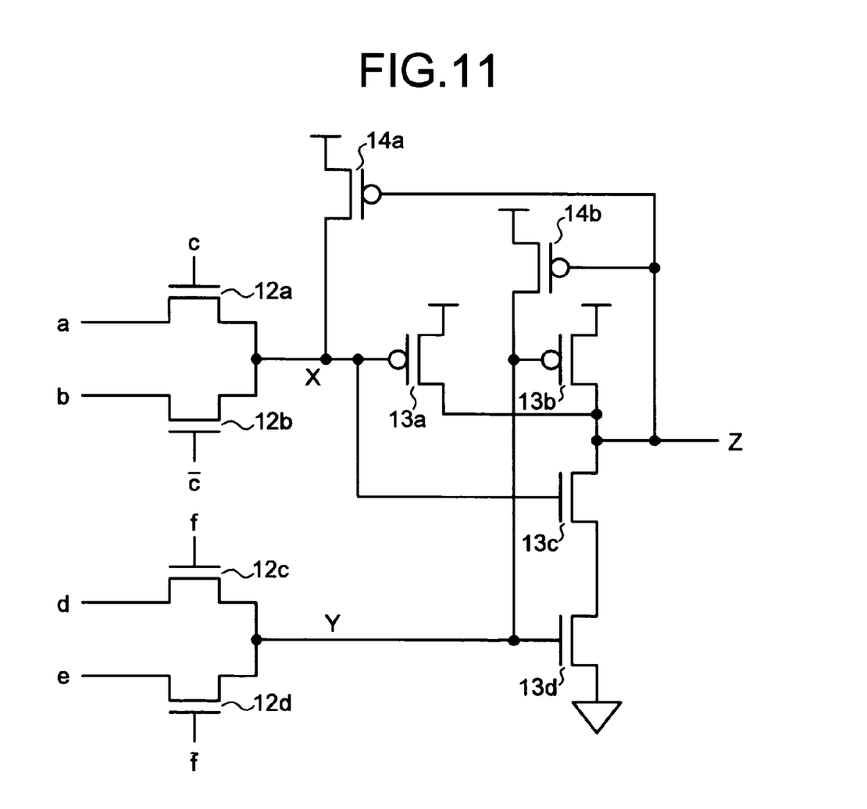
FIG. 11 is a detailed circuit diagram of the conventional pass transistor logic circuit.

FIG. 11 is a detailed circuit diagram of the conventional pass transistor logic circuit disclosed in Japanese Patent Laid-Open Publication No. H9-93118. In the pass transistor logic circuit, a pass transistor circuit 12a and a pass transistor circuit 12b form a first signal input system. A pass transistor circuit 12c and a pass transistor circuit 12d form a second signal input system.

A NAND circuit is formed with p-channel MOS transistors 13a and 13b and n-channel MOS transistors 13c and 13d. Moreover, in the pass transistor logic circuit, p-channel MOS transistors 14a, and 14b, stabilize the signal levels of signal X and signal Y with the aid of output signal Z of the NAND circuit.

However, the circuitry in the conventional technology disclosed in Japanese Patent Laid-Open Publication No. H9-93118 does not form the selector circuit that outputs one signal selected from a plurality of input signals.

In other words, structure of the selector circuit that can prevent increase in the wiring area, slowing of the signal waveforms and signaling delay goes beyond providing a plurality of signal input systems requiring a device for generating the control signals for the pass transistor circuits 10a to 10d and 12a to 12d that control the conduction of signals.

SUMMARY OF THE INVENTION

It is an object of the present invention to solve at least the above problems in the conventional technology.

A selector circuit according to one aspect of the present invention, which outputs a single signal from among a plurality of input signals, includes a plurality of conduction control circuits that controls conduction of the input signals; a logical operation circuit that receives output signals from each of the conduction control circuits via a plurality of signal paths, and performs a logical operation on each of the output signals to output the single signal; a signal-level setting circuit that sets, when the conduction of the input signals in the conduction control circuits connected to a same signal path is blocked, a signal level of the signal path; and a control-signal generating circuit that generates a first control signal that controls the conduction control circuits to select only one input signal for conduction, and a second control signal that controls the signal-level setting circuit to set the signal level of the signal path, by performing a logical operation on a same input signal.

The other objects, features, and advantages of the present invention are specifically set forth in or will become apparent from the following detailed description of the invention when read in conjunction with the accompanying drawings.

DETAILED DESCRIPTION

Exemplary embodiments according to the present invention are explained in detail below with reference to the accompanying drawings.

Figure 1:
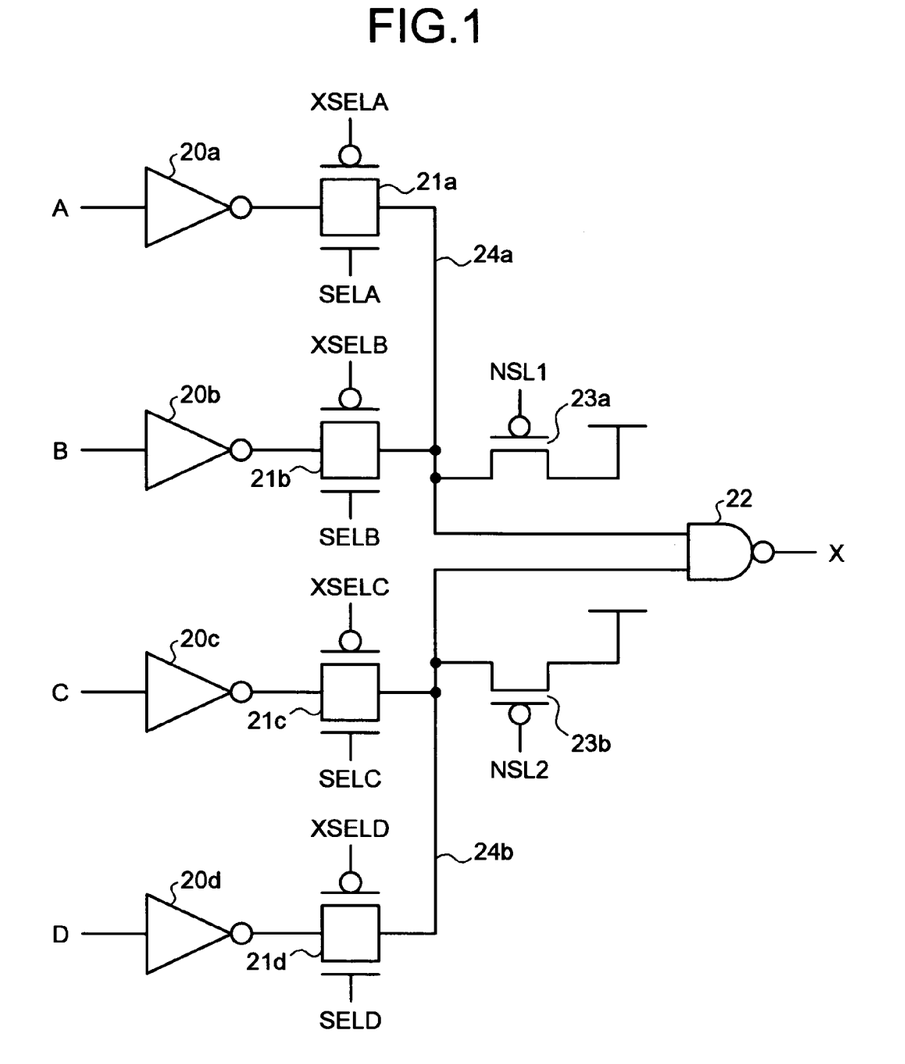
FIG. 1 is a circuit diagram of a selector circuit according to a first embodiment of the present invention.

FIG. 1 is a circuit diagram of a selector circuit according to a first embodiment of the present invention. The selector circuit includes inverter circuits 20a to 20d, pass transistor circuits 21a to 21d, a NAND circuit 22, and p-channel transistor circuits 23a and 23b.

Since the inverter circuits 20a to 20d and the NAND circuit 22 are constructed from transistors, amplification of signals can be carried out, thereby remedying slowing of the signal waveforms. Moreover, CMOS inverter circuits that have a fast signal rising are used as the inverter circuits 20a to 20d.

Each of the inverter circuits 20a to 20d is connected to one each of the pass transistor circuits 21a to 21d. Each of the pass transistor circuits 21a to 21d is connected to the NAND circuit 22 by two separate wirings 24a and 24b.

Moreover, the p-channel transistor circuits 23a and 23b are connected to each of the wires 24a and 24b so that the wires are not in a state of electrical disconnection when the pass transistor circuits 21a to 21d block the conduction of signals.

In the selector circuit, input signals A to D are input into the inverter circuits 20a to 20d. The inverter circuits 20a to 20d invert the signal level of the input signals A to D and input the signals with the inverted signal level into the pass transistor circuits 21a to 21d.

The pass transistor circuits 21a to 21d control the conduction of the signals received from the inverter circuits 20a to 20d according to control signals SELA to SELD, and XSELA to XSELD.

The signal levels of the control signal SELA and the control signal XSELA are mutually inverted. To be specific, when the signal level of the control signal SELA is "H", the signal level of the control signal XSELA becomes "L". Conversely, when the signal level of the control signal SELA is "L", the signal level of the control signal XSELA becomes "H".

Similarly, the signal levels of the control signal SELB and the control signal XSELB, the signal levels of the control signal SELC and the control signal XSELC, and the signal levels of the control signal SELD and the control signal XSELD are also mutually inverted.

Moreover, among the control signals XSELA to XSELD, only one signal is set to a different signal level than the rest of the control signals XSELA to XSELD. For example, when the signal level of the control signal XSELA is "L", the signal level of the control signals XSELB to XSELD becomes "H".

The p-channel transistor circuits 23a and 23b are activated by the control signals generated by performing logical operation on the same signals as the signals that generate the control signals input into the pass transistor circuits 21a to 21d.

In other words, since the control signals of the p-channel transistor circuits 23a and 23b and the control signals of the pass transistor circuits 21a to 21d are generated substantially simultaneously from the same signals, signaling delay can be prevented.

Figure 2:
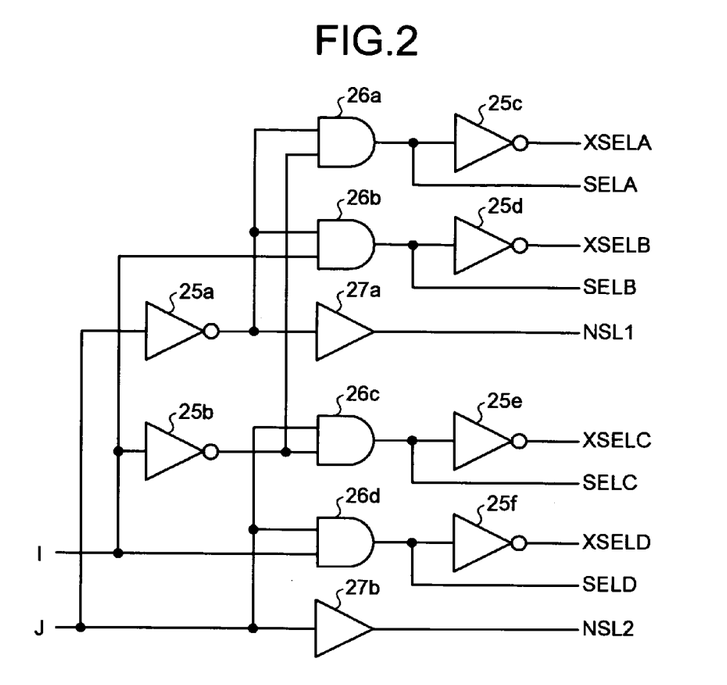
FIG. 2 is a circuit diagram of an example of a control-signal generating circuit that generates control signals that control pass transistor circuits 21a to 21d as well as p-channel transistor circuits 23a and 23b.
Figure 3:
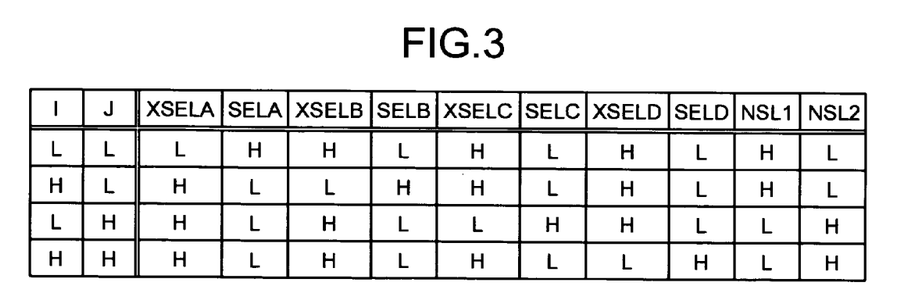
FIG. 3 is a table of signal levels of the signals generated by the control-signal generating circuit shown in FIG. 2.

FIG. 2 is a circuit diagram of an example of a control-signal generating circuit that generates control signals that control pass transistor circuits 21a to 21d as well as p-channel transistor circuits 23a and 23b. FIG. 3 is a table of signal levels of the signals generated by the control-signal generating circuit shown in FIG. 2.

The control-signal generating circuit includes inverter circuits 25a to 25f, AND circuits 26a to 26d, and buffers 27a and 27b as shown in FIG. 2.

The control-signal generating circuit outputs, according to the combination of the signal levels of the input signals I and J, the control signals XSELA to XSELD, SELA to SELD as well as control signals NSL1 and NSL2 having the signal levels shown in FIG. 3.

To be specific, the control-signal generating circuit generates, according to the combination of the input signals I and J, pairs of control signals with mutually inverted signal levels as shown in FIG. 3. In other words, the control-signal generating circuit generates pairs of the control signals XSELA and SELA, the control signals XSELB and SELB, the control signals XSELC and SELC, and the control signals XSELD and SELD with mutually inverted signal levels.

Among the control signals XSELA to XSELD, only one signal is set to a different signal level than the rest of the control signals XSELA to XSELD.

The signal level of the control signals NSL1 and NSL2 that control the p-channel transistor circuits 23a and 23b is set to "L" when all the pass transistor circuits 21a to 21d connected to the wires 24a and 24b block the conduction of signals, and the signal level of the wires 24a and 24b is set to "H".

In the example given above, when the signal level of the control signal XSELA or the control XSELB is "L", the signal level of the control signal NSL2 becomes "L". When the signal level of the control signal XSELC or the control signal XSELD is "L", the signal level of the control signal NSL1 becomes "L".

Thus, one signal from the signals output from the inverter circuits 20a to 20d is input into the NAND circuit 22 along with the output signals of signal level "H" that are output from the p-channel transistor circuits 23a and 23b when the signal level of the control signals NSL1 and NSL2 is set to "L". Since the p-channel transistor circuits 23a and 23b are transistor circuits, signals of considerably high signal level can be output.

The NAND circuit 22 performs NAND operation on the input signals and outputs the resulting signal. The signal level of this signal is the same as that of the signal that is selected from among the input signals A to D for conduction via the pass transistor circuits 21a to 21d.

Thus, according to the first embodiment, four pass transistor circuits 21a to 21d control the conduction of the input signals. The NAND circuit 22, which, via the two wires 24a and 24b, receives the output signals from each of the pass transistor circuits 21a to 21d and outputs a single signal by carrying out a NAND operation on each of the received signals. The p-channel transistor circuits 23a and 23b that set the signal level of the wires 24a and 24b when the conduction of the input signals is blocked by all the pass transistor circuits 21a to 21d connected to the wires 24a and 24b. The control-signal generating circuit, which, by carrying out logical operation on the same input signals, generates the control signals that control the pass transistor circuits 21a to 21d so as to select only a single input signal for conduction, as well as the control signals that control the p-channel transistor circuits 23a and 23b so as to set the signal level of the wires 24a and 24b. Consequently, the increase in the wiring area, slowing of the signal waveforms and signaling delay can be prevented.

Further, according to the first embodiment, the inverter circuits 20a to 20d output signals with signal levels that are the reverse of the signal level of the input signals. The pass transistor circuits 21a to 21d control the conduction of the signals output from the inverter circuits 20a to 20d. The NAND circuit 22 outputs the result of the NAND operation as the output signal. Since both the inverter circuits 20a to 20 and the NAND circuit 22 carry out amplification of signals, slowing of the signal waveforms can be further improved with the aid of the inverter circuits 20a to 20d and the NAND circuit 22.

Further, since the inverter circuits 20a to 20d according to the first embodiment are CMOS inverter circuits, signal rising can be made faster, thus further improving slowing of the signal waveforms as well as signaling delay.

According to the first embodiment, the pass transistor circuits 21a to 21d are used as the conduction control circuits. Thus, it is also possible to reduce the number of the transistors used by forming circuits that control the conduction by CMOS logic operation According to the first embodiment, the p-channel transistor circuits 23a and 23b set the signal level of the wires 24a and 24b when all the pass transistor circuits 21a to 21d connected to the same wires 24a and 24b block the conduction of the input signals. Thus, signals of considerably high levels can be fed into the wires 24a and 24b, thereby remedying signaling delay.

A selector circuit that selects and outputs one input signal from among four input signals is explained according to the first embodiment. However, the number of input signals is not limited to four, and the present invention may also be applied to a selector circuit that selects and outputs a single input signal from among any number of input signals. An example of a selector circuit that selects and outputs a single input signal from among eight input signals is explained in a second embodiment of the present invention.

Figure 4:
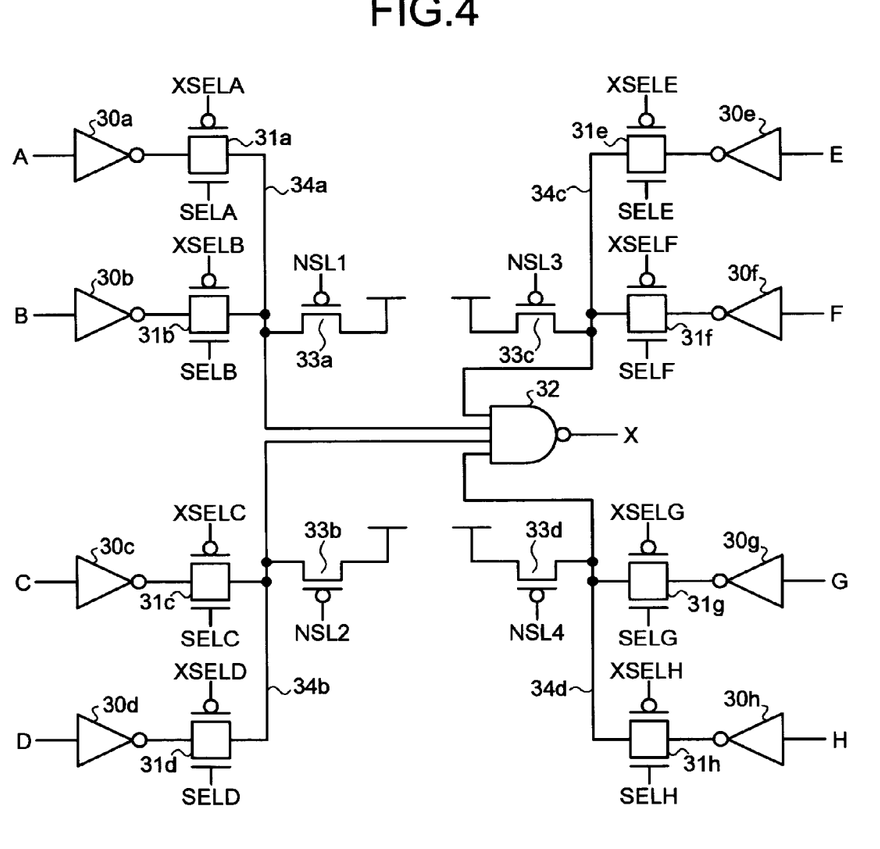
FIG. 4 is a circuit diagram of a selector circuit according to a second embodiment of the present invention.

FIG. 4 is a circuit diagram of a selector circuit according to a second embodiment of the present invention. As shown in FIG. 4, the selector circuit includes inverter circuits 30a to 30h, pass transistor circuits 31a to 31h, a NAND circuit 32, and p-channel transistor circuits 33a to 33d.

Each of the inverter circuits 30a to 30h is connected to one each of the pass transistor circuits 31a to 31h. Each of the pass transistor circuits 31a to 31h is connected to the NAND circuit 32 by four wires 34a to 34d.

The p-channel transistor circuits 33a to 33d are connected to each of the wires 34a to 34d so that the wires 34a to 34d are not in a state of electrical disconnection when the pass transistor circuits 31a to 31h block the conduction of signals.

In the selector circuit, input signals A to H are input into the inverter circuits 30a to 30h. The inverter circuits 30a to 30h invert the signal level of the input signals A to H, and input the signals with inverted signal levels into the pass transistor circuits 31a to 31h.

The pass transistor circuits 31a to 31h control the conduction of the signals received from the inverter circuits 30a to 30h according to control signals SELA to SELH and XSELA to XSELH.

The signal levels of the control signal SELA and the control signal XSELA are mutually inverted. To be specific, when the signal level of the control signal SELA is "H", the signal level of the control signal XSELA becomes "L". Conversely, when the signal level of the control signal SELA is "L", the signal level of the control signal XSELA becomes "H".

Similarly, the signal levels of the control signal SELB and the control signal XSELB, the signal levels of the control signal SELC and the control signal XSELC, the signal levels of the control signal SELD and the control signal XSELD, the signal levels of the control signal SELE and the control signal XSELE, the signal levels of the control signal SELF and the control signal XSELF, the signal levels of the control signal SELG and the control signal XSELG, and the signal levels of the control signal SELH and the control signal XSELH are also mutually inverted.

Moreover, among the control signals XSELA to XSELH, only one signal is set to a different signal level than the rest of the control signals XSELA to XSELH. For example, when the signal level of the control signal XSELA is "L", the signal level of the control signals XSELB to XSELH becomes "H".

The p-channel transistor circuits 33a to 33d are activated by the control signals generated by performing logical operation on the same signals as the signals that generate the control signals input into the pass transistor circuits 31a to 31h.

Figure 5:
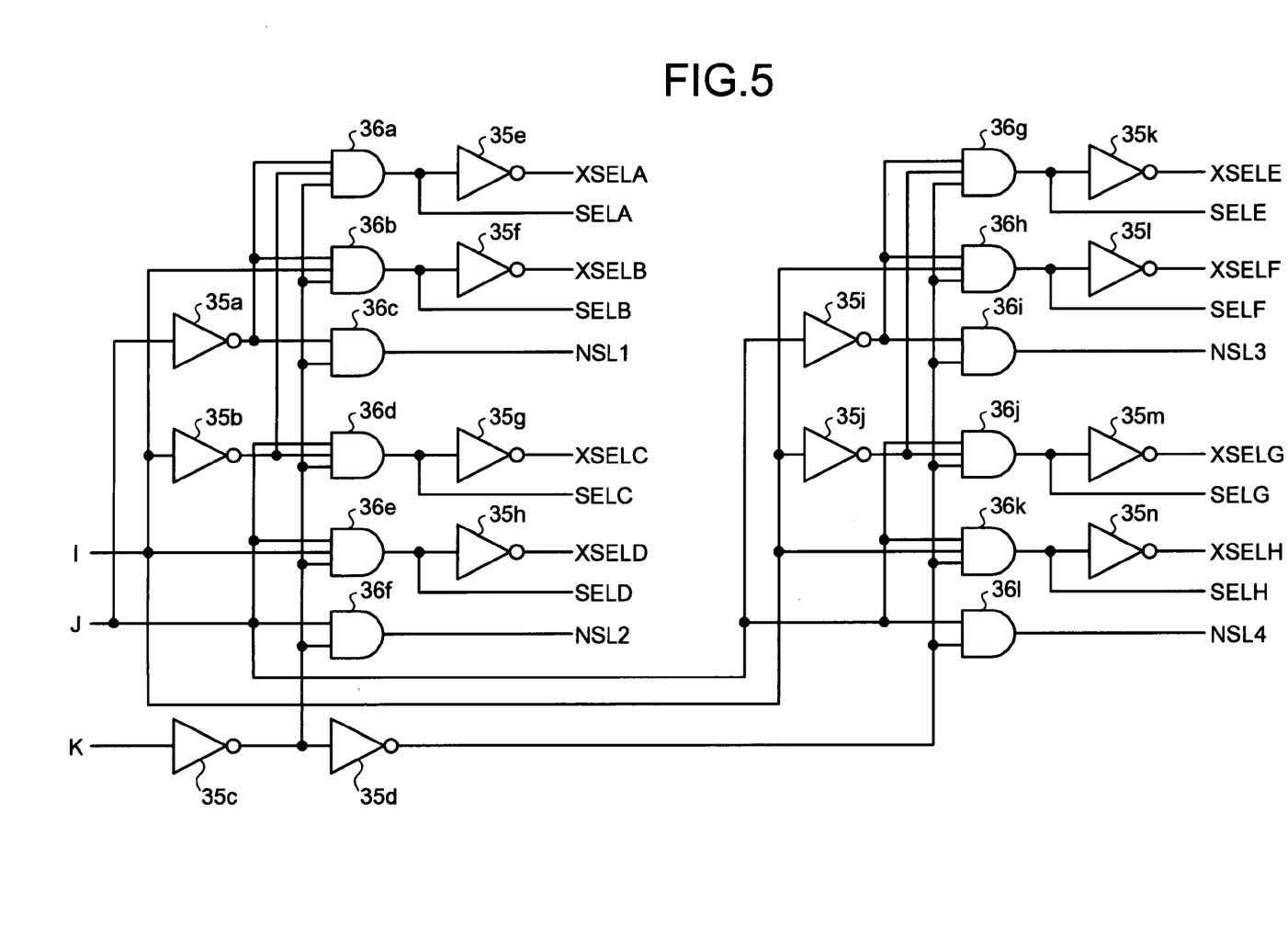
FIG. 5 is a circuit diagram of another example of a control-signal generating circuit that generates control signals that control pass transistor circuits 31a to 31h as well as p-channel transistor circuits 33a to 33d.
Figure 6:
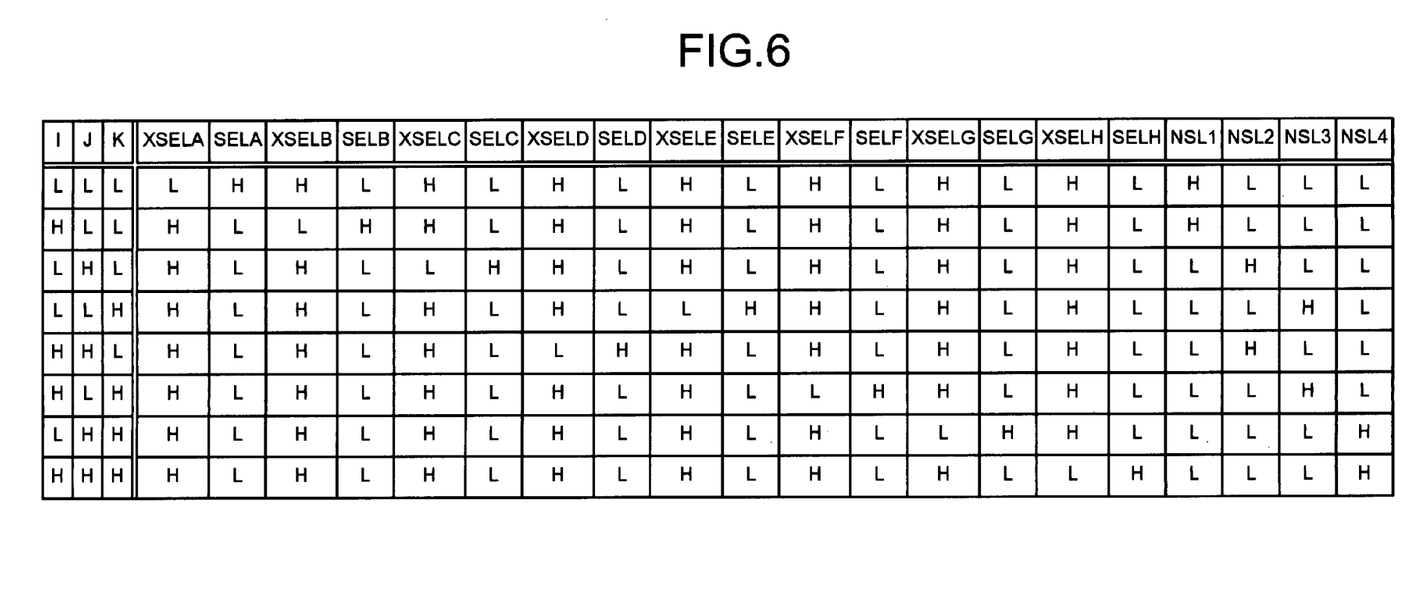
FIG. 6 is a table of signal levels of signals generated by the control-signal generating circuit shown in FIG. 5.

FIG. 5 is a circuit diagram of another example of a control-signal generating circuit that generates control signals that control pass transistor circuits 31a to 31h as well as p-channel transistor circuits 33a to 33d. FIG. 6 is a table of signal levels of signals generated by the control-signal generating circuit shown in FIG. 5.

As shown in FIG. 5, the control-signal generating circuit includes inverter circuits 35a to 35n as well as AND circuits 36a to 36l.

The control-signal generating circuit outputs, according to the combination of the signal levels of input signals I, J, and K the control signals XSELA to XSELH, SELA to SELH as well as control signals NSL1, NSL2, NSL3 and NSL4 having the signal levels shown in FIG. 6.

The control-signal generating circuit generates, according to the combination of the input signals I, J, and K, pairs of control signals with mutually inverted signal levels, as shown in FIG. 6. In other words, the circuit generates pairs of the control signals SELA and XSELA, the control signals SELB and XSELB, the control signals SELC and XSELC, the control signals SELD and XSELD, the control signals SELE and XSELE, the control signals SELF and XSELF, the control signals SELG and XSELG, and the control signals SELH and XSELH with mutually inverted signal levels.

Among the control signals XSELA to XSELH, only one signal is set to a different signal level than the rest of the control signals XSELA to XSELH.

The signal level of the control signals NSL1, NSL2, NSL3, and NSL4 that control the p-channel transistor circuits 33a to 33d is set to "L" when all the pass transistor circuits 31a to 31h connected to the wires 34a to 34d block the conduction, and the signal level of the signals of the wires 34a to 34d is set to "H".

When the signal level of the control signal XSELA or the control signal XSELB is "L", the signal level of the control signal NSL2, the control signal NSL3, and the control signal NSL4 becomes "L". When the signal level of the control signal XSELC or the control signal XSELD is "L", the signal level of the control signal NSL1, the control signal NSL3, and the control signal NSL4 becomes "L".

When the signal level of the control signal XSELE or the control signal XSELF is "L", the signal level of the control signal NSL1, the control signal NSL2, and the control signal NSL4 becomes "L". When the signal level of the control signal XSELG or the control signal XSELH is "L", the signal level of the control signal NSL1, the control signal NSL2, and the control signal NSL3 becomes "L".

Thus, one signal from the signals with the signal level "H" or "L" which are output from the inverter circuits 30a to 30h is input into the NAND circuit 32 along with the output signals with the signal level "H" that are output from the p-channel transistor circuits 33a to 33d when the control signals NSL1 to NSL4 are set to "L".

The NAND circuit 32 performs NAND operation on the input signals and outputs the resulting signal. The signal level of this signal is the same as that of the signal that is selected from among the input signals A to H for conduction via the pass transistor circuits 31a to 31h.

The present invention explained according to the first embodiment can be easily applied to the selector circuit that selects and outputs a single input signal from any number of input signals, as explained in the second embodiment.

According to the present invention, a plurality of conduction control circuits control the conduction of input signals. A logical operation circuit is which, via a plurality of signal paths, receives output signals from each of the conduction control circuits, and by carrying out logical operation on each of the received signals, outputs a single signal. Signal-level setting circuits set the signal level of the signal paths when the conduction of the input signals is blocked by all the conduction control circuits connected to the same signal path. Further, a control-signal generating circuit which, by carrying out logical operation for the same input signals, generates control signals that control the conduction control circuits so as to select only one input signal for conduction, as well as control signals that control the signal-level setting circuits so as to set the signal level of the signal path. Thus, increase in the wiring area, slowing of the signal waveforms as well as signaling delay can be prevented.

Furthermore, according to the present invention, inverter circuits output signals by inverting the signal level of the input signals. The conduction control circuits control the conduction of the signals output from the inverter circuits. The logical operation circuit is a NAND circuit that outputs the result of a NAND operation on the inverted signals as an output signal. Since the inverter circuits and the NAND circuit carry out amplification of signals, slowing of the signal waveforms can be further improved with the aid of the inverter circuits and the NAND circuits.

Moreover, according to the present invention, since the inverter circuits are CMOS inverter circuits, the signal rising can be made faster, thus further improving slowing of the signal waveforms and signaling delay.

Furthermore, according to the present invention, since the conduction control circuits are pass transistor circuits, by forming the conduction control circuits with CMOS logic circuits, the number of transistors that are used can be reduced.

Moreover, according to the present invention, since the signal-level setting circuits are transistor circuits, signals of considerably high signal level can be fed into the signal path, thus remedying signaling delay.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A selector circuit that outputs a single signal from among a plurality of input signals, the selector circuit comprising:
   a plurality of conduction control circuits that controls conduction of the input signals;
   a logical operation circuit that receives output signals from each of the conduction control circuits via a plurality of signal paths, and performs a logical operation on each of the output signals to output the single signal;
   a signal-level setting circuit that sets, when the conduction of the input signals in the conduction control circuits connected to a same signal path is blocked, a signal level of the signal path; and a control-signal generating circuit that generates a first control signal that controls the conduction control circuits to select only one input signal for conduction, and a second control signal that controls the signal-level setting circuit to set the signal level of the signal path, by performing a logical operation on a same input signal.

2. The selector circuit according to claim 1, further comprising an inverter circuit that inverts a signal level of the input signal, wherein the conduction control circuits control an inverted signal output from the inverted circuit, the logical operation circuit is a NAND circuit that outputs a result of a NAND operation, and the inverter circuit and the NAND circuit perform an amplification of a signal.

3. The selector circuit according to claim 2, wherein the inverter circuit is a CMOS inverter circuit.

4. The selector circuit according to claim 1, wherein the conduction control circuits are pass transistor circuits.

5. The selector circuit according to claim 1, wherein the signal-level setting circuit is a transistor circuit.

* * * * *